United States Patent
Karlsson et al.

(10) Patent No.: US 7,071,678 B2
(45) Date of Patent: Jul. 4, 2006

(54) LOW POWER CONSUMING CURRENT MEASUREMENTS FOR HIGH CURRENTS

(75) Inventors: Ulf Bengt Ingemar Karlsson, Tyresö (SE); Erik Anders Lindgren, Nacka (SE); Thord Agne Gustaf Nilson, Tyresö (SE)

(73) Assignee: Danaher Motion Stockholm AB, Stockholm (SE)

( * ) Notice: Subject to any disclaimer, the term of this patent is extended or adjusted under 35 U.S.C. 154(b) by 0 days.

(21) Appl. No.: 10/881,844

(22) Filed: Jun. 29, 2004

(65) Prior Publication Data

US 2005/0001706 A1    Jan. 6, 2005

(30) Foreign Application Priority Data

Jul. 3, 2003    (SE) ................... 0301961

(51) Int. Cl.
*G01R 15/18*    (2006.01)
(52) U.S. Cl. ................. 324/117 R
(58) Field of Classification Search ........... 324/117 R, 324/117 H, 765, 158.1, 127; 336/182
See application file for complete search history.

(56) References Cited

U.S. PATENT DOCUMENTS

| | | | | |
|---|---|---|---|---|
| 3,996,543 A | * | 12/1976 | Conner et al. .......... | 336/58 |
| 4,298,838 A | * | 11/1981 | Akamatsu et al. ...... | 324/117 R |
| 4,320,433 A | * | 3/1982 | Yamaki .................. | 361/45 |
| 4,482,862 A | * | 11/1984 | Leehey .................. | 324/117 R |
| 5,053,695 A | | 10/1991 | Canter | |
| 5,066,903 A | * | 11/1991 | Ochi ..................... | 324/96 |
| 5,552,979 A | | 9/1996 | Gu et al. | |
| 5,811,965 A | | 9/1998 | Gu | |

OTHER PUBLICATIONS

Severns, Rudolf, "Improving and Simplifying HF DC Current Sensors," Proceedings of the 1986 IEEE Applied Power Electronics Conference (APEC 86), pp. 180-183.

* cited by examiner

*Primary Examiner*—Jermele Hollington
*Assistant Examiner*—Tung X. Nguyen
(74) *Attorney, Agent, or Firm*—Frishauf, Holtz, Goodman & Chick, P.C.

(57) ABSTRACT

This invention propose a way of controlling the flux density in a current transformer to keep the transformer core saturated between two consecutive measurements in a sampling measurement system. Saturation disables transformation of primary to secondary current, and thereby disables losses in the secondary circuit during this time. Both AC and DC currents are possible to measure. The use of saturation of the transformer core also permits the core to be designed physically very small. In order to get effective and accurate low power consuming measurements, both the magnetic fields originating from primary current flowing in the primary winding and external magnetic fields must be symmetrically physically spread in the transformer core. This greatly limits the possible physical arrangement of the primary winding. The invention describes a method dividing the secondary winding into two or more separate winding sections, greatly reducing this demand and permitting a asymmetrically spread magnetic field in the core without decreasing the efficiency and accuracy of the measurements.

12 Claims, 3 Drawing Sheets

LOW POWER CONSUMING CURRENT MEASUREMENTS FOR HIGH CURRENTS

FIELD OF THE INVENTION

This invention relates to a current transformer having one primary winding, one or more secondary windings wound on a core, and transforming a primary current into a turns-ratio scaled secondary current. The primary current, flowing in the primary winding, is measured indirectly by measuring the secondary current, flowing in the secondary winding. Using a current transformer gives opportunity to prescale the primary current to a lower secondary current, according to the turns-ratio between primary and secondary windings. The primary current is also galvanically separated from the secondary current and measurement electronics.

DESCRIPTION OF RELATED ART

This known technique is highly power consuming, especially for high magnitude primary currents. It also suffers from secondary current waveform distortion due to saturation of the transformer core. Saturation of the transformer core also eliminates the possibility of measuring primary currents with a DC bias.

Solutions to enable measurements of DC biased primary currents do exist. Most of these solutions comprise a cancellation circuits, to cancel out the flux originating from the DC bias. These techniques work with a time continuous transformation of a primary current to a secondary current. A constantly flowing secondary current gives constantly arise of losses in the secondary circuit with a high power consumption and heating as a result.

A well known compensating method is based on measurement of the flux level in the transformer core and compensation of the flux originating from the primary current with a secondary current in the secondary winding. This is to keep the total flux level in the core near zero. The compensating secondary current is then a constantly flowing turns-ratio scaled image of the primary current.

A similar technique is described in U.S. Pat. No. 5,552, 979. According to this known technique the flux level in the transformer core is calculated from the voltage over the secondary winding, and is constantly controlled to be kept within positive and negative saturation.

U.S. Pat. No. 5,053,695 describes a technique similar to the invention. According to this technique a circuit periodically resets the flux level in the current transformer core from saturated to unsaturated. The difference between this known technique and the invention is that the flux level is not actively controlled to be at a saturated level as much as possible between two consecutive measurements. In the disclosed technique the core is never actively controlled to go as fast as possible to a saturated flux level and stay there in order to lower the losses.

A similar method of controlling a current transformer is described in R. Severns, "Improving and simplifying HF DC current sensors", Proceedings of the 1986 IEEE Applied Power Electronics Conference (APEC 86), pp. 180–183. This paper describes a method periodically driving a current transformer core in and out of saturation. The suggested new technique improves the ability to measure current in any arbitrary direction, and a way of making the current transformer core go in to and out of saturation fast, for high and physically asymmetric magnetic fields induced by primary current in the primary winding, thereby greatly reducing the losses and increasing the ability to measure high currents.

Still another method is described in U.S. Pat. No. 5,811, 965. This method involves a constant application of an alternating voltage to the secondary winding of a current transformer. This guarantees that the transformer core is in the linear region when the measurements are conducted.

SUMMARY OF THE INVENTION

The invention aims at lowering losses and power consumption by disabling secondary current flow between two consecutive measurements. Digital systems sample measurement values in a repeating time discrete fashion two consecutive measurements are separated in time. This eliminates the need of a continuously valid measurement signal, in this case the secondary current. Disabling the secondary current, as described, reduces the losses with approximately the ratio between the time when current flows during one measurement and the total time between two measurements.

Disabling of secondary current flow is done by controlling the flux level in the transformer core. The basic idea is to shut off the current flowing in the secondary winding or the secondary winding sections by saturating the current transformer core, when there is no need to do any measurements. The more of the total time the secondary current flow is shut off, the lower the losses will be. In order to have a short period of secondary current flow, the core has to go fast in to and out of saturation, and the leakage inductance of the secondary winding must be low in order for the secondary current to rise fast.

The use of a current transformer according to the invention demands highly symmetric magnetic fields in the transformer core. If the magnetic fields are asymmetric, or the core is exposed to other external fields, the time needed by the transformer core to desaturate will be longer compared to if the magnetic fields were symmetric. The need of symmetric magnetic fields becomes more evident for high primary currents. By dividing the secondary winding into two or more secondary winding sections the need of a symmetric magnetic field in the transformer core can be reduced.

DETAILED DESCRIPTION

Figure 1:
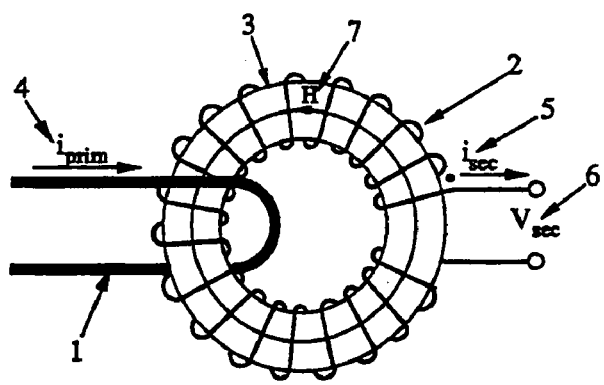
FIG. 1 shows a typical prior art current transformer with a one turn primary winding and a secondary winding, wound on a toroidal core.

FIG. 1 illustrates a typical prior art current transformer having a primary winding 1 and a secondary winding 2, both wound on a toroidal core 3. Primary current 4 is transformed to a turns ratio scaled secondary current 5. A preferable way of implementing the primary winding 1 of a current transformer is to let the wire carrying the primary current 4, the current to be measured, be circumfered by the toroidal transformer core 3. It is of course possible to make a primary winding with more than one turn.

Figure 2:
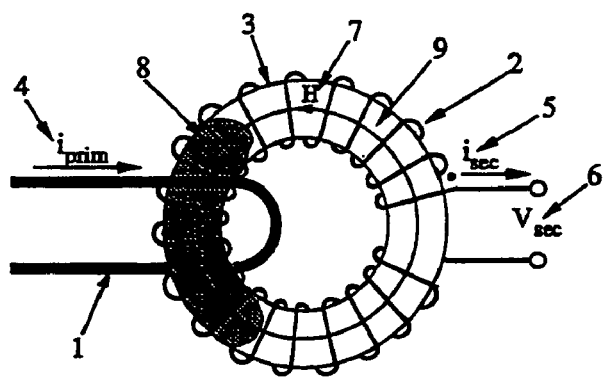
FIG. 2 shows the transformer of FIG. 1 and illustrates a partially unsaturated prior art current transformer core.
Figure 3:
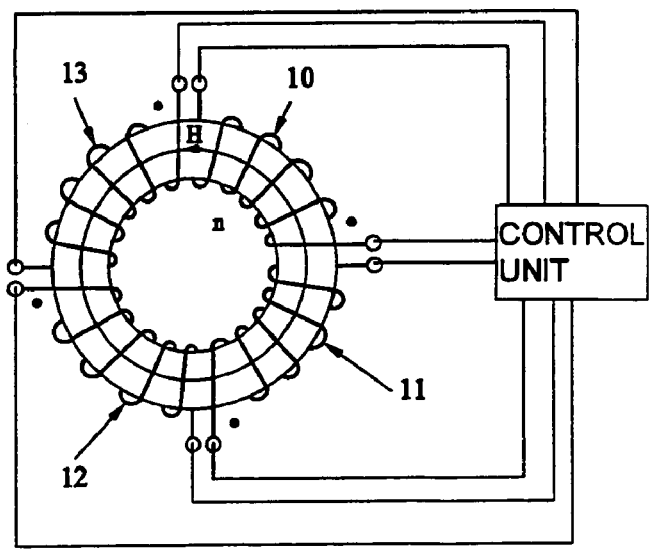
FIG. 3 shows a current transformer according to the invention with four secondary winding sections, the primary winding is omitted for clarity.
Figure 4:
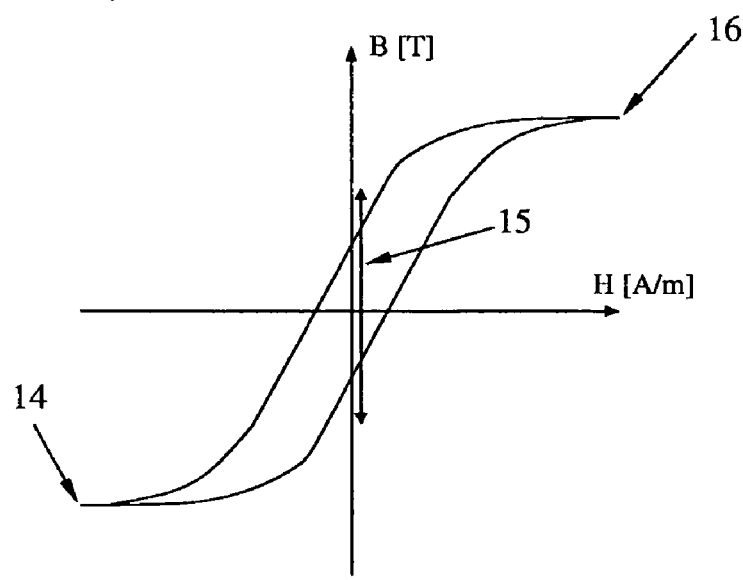
FIG. 4 shows a typical (not in scale) core material BH-curve.

Transformation of primary current to secondary current in a current transformer takes place as long as the primary current can cause a flux density change in the transformer core. The change of flux per unit time in a transformer core is proportional to the EMF induced in a winding and inversely proportional to the number of turns in the winding. The EMF in the winding is equal to the voltage applied over the winding 6 minus resistive voltage drops. The direction of the EMF in FIGS. 1–3 is shown by arrow H, designated by reference numeral 7. As long as the transformer core is not saturated, the EMF will adjust itself, depending on the voltage over the winding, to let a secondary current flow with a magnitude equal to the turns ratio scaled magnitude of a primary current. By controlling the voltage over the winding, the EMF can be controlled, and thereby the change of flux per unit time in the transformer core. By connecting a load, for example a shunt resistor over the secondary winding a voltage proportional to the secondary current can be measured over this resistor.

The basic property of the invention is to lower the losses in the measurement circuit and the secondary winding or secondary winding sections. In order to achieve that, the secondary current should only be allowed to flow a short period of time, before, during and after the measurement is conducted. In order to disable secondary current flow during the rest of the time the transforming function of the transformer core is disabled. Transformation takes place as long as the primary current causes a flux change in the transformer core. If the transformer core is saturated, the level of flux is at its maximum for positive saturation 16 or at its minimum for negative saturation 14. No further significant increase beyond positive saturation level and decrease beyond negative saturation level is possible. These facts are used, and transformation is disabled by saturating the transformer core.

Positive saturation is in this document defined as the flux level the core would saturate at when short circuited by a load resistance and having positive primary current flowing in the primary winding. In case of negative primary current the core would saturate at negative saturation level, which only differs from the positive in the sense of sign.

Figure 5:
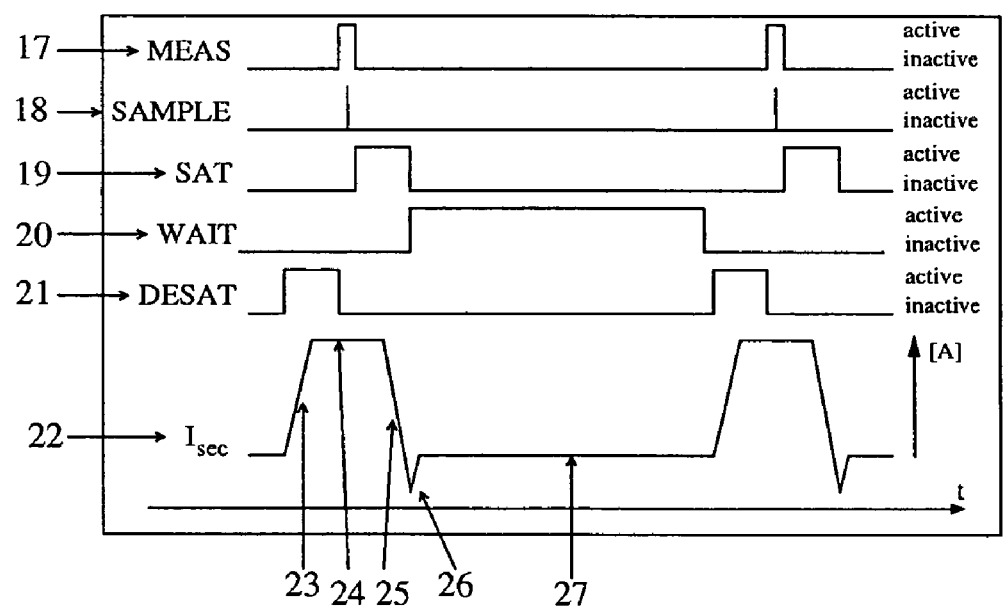
FIG. 5 shows a diagram illustrating the location in time of the four states used to describe the invention. It also shows a typical secondary current waveform at positive primary current.

In order to describe the invention, four different states are defined. The location of the states in time is described in FIG. 5. FIG. 5 also includes an illustration of a positive secondary current waveform.

wait-state 20: the time between two consecutive measurements, between SAT state and DESAT state.

measurement-state 17: secondary current is transformed during this state and is valid for measurements. Measurements are taken when the sample signal 18 is high. See FIG. 5.

desaturation-state 21: the transformer core is controlled to go out of saturation during this state, and secondary current begins to flow as shown at 23 in FIG. 5.

saturation-state 19: the transformer core is controlled to go in to saturation during this state, and secondary current stops flowing as shown at 25 in FIG. 5.

During the measurement-state 17 the flux level in the current transformer core is in the linear region 15 of the BH-curve. The secondary winding is short circuited by a shunt resistor, to allow for measurements of secondary current by measuring the voltage over the resistor. The resistance must be low to keep the voltage over it low, and to keep the losses in the resistor low. The voltage over the secondary winding will depend on secondary current and the total resistance of the circuit including the shunt resistor, cables, winding wire and switches. The voltage is positive when a positive secondary current flows, the EMF will then also be positive, and the flux change in the transformer core will be positive. The flux level in the transformer core will increase towards positive saturation. For a negative primary current the flux will decrease towards negative saturation.

After the measurement is finished the flux level in the transformer core is driven to saturation, during the saturation-state. This is done by applying a voltage, positive for positive primary currents and negative for negative primary currents, to the secondary winding. The transformer core will slowly drift towards saturation during the measurement-state. To make the drift faster during the saturation-state, a voltage greater than the measurement voltage is applied to the secondary winding. When the transformer core is saturated, transformation of secondary current stops as shown at 25 in FIG. 5. Due to saturation the EMF will decrease towards zero. Before the transformer core is saturated, the secondary current is directed so as to deliver power to the secondary power supply, further reducing the total losses. When the core EMF decreases, secondary current will decrease as shown at 25 in FIG. 5 and finally change direction, as shown at 26 in FIG. 5, when the EMF decreases below the supply voltage 40. Secondary current will now be directed so as to draw power from the secondary power supply. Current flow out of the supply in the saturation-state is used as a condition to sense saturation of the core. The change of direction is illustrated in FIG. 5 for a positive primary current and the saturation detection level 26. The actual level of current flowing out of the supply must be set high enough so as not to trip when a small reversed sign current is measured.

Saturation of the transformer core activates the wait-state. The secondary winding is connected as in the measurement-state during the wait-state. No secondary current will flow, as shown at 27 in FIG. 5, as long as the current transformer core is saturated in the direction of primary current. For a positive primary current and positive saturation no further increase of flux is possible, and no transformation takes place. However if the primary current changes sign a decrease is possible, and a negative primary current will be transformed. For a negative primary current and negative saturation no further decrease of flux is possible, but an increase is possible, and positive primary current can be transformed. The primary current direction is detected during the measurement-state and according to this direction the core is saturated positive for positive primary current or negative for negative primary current.

Short before the next measurement the current transformer core is desaturated, driven in to the linear region of the material BH-curve. For positive directed primary current a negative voltage is applied over the secondary winding. This will make the EMF negative and a negative flux change will take place. The flux level in the core will decrease from positive saturation level in to the linear region of the material BH-curve. For negative directed primary current, a positive voltage is applied. This results in a positive EMF and the flux level in the core increase from negative saturation into the linear region. In the linear region, primary current is transformed to a turns-ratio scaled secondary current.

It is hard to detect when the core has been driven into the linear region. To avoid a difficult detection, the duration of the saturation-state is predetermined to a fixed time. The time must be long enough to drive the transformer core into the linear part of the core material BH-curve. It must also be long enough to allow for the secondary current to rise 23 to the amplitude 24 of the turns-ratio scaled primary current amplitude. In order to get effective and low power consuming measurements this time has to be reduced as much as possible. The rise time of the secondary current is limited by leakage inductances and effects caused by asymmetric magnetic fields. The leakage inductance of the secondary winding or the secondary winding sections can be minimised by minimising the number of secondary turns and using a core size with a small cross sectional area compared to the radius.

The entire core must be in the linear region in order to get a turns-ratio scaled secondary current. If the flux level in some parts of the core is in the non-linear region or at saturation level, secondary current magnitude will differ from the turns-ratio scaled primary current magnitude. The desaturation-state duration must be long enough to allow for the entire core to reach a flux level within the linear region of the core material BH-curve. If the core is exposed to asymmetric magnetic fields, for example caused by an asymmetrically placed primary winding or external fields originating from somewhere else, the parts of the core exposed to less magnetic field desaturate before parts exposed to more magnetic field. EMF in the first desaturated parts will decrease the current rise in the whole secondary winding. The decrease of secondary current rise will make the desaturation of the still saturated parts slower, compared to if the core was perfectly symmetrically desaturated. The earlier described way of implementing the primary winding, with the power cable making a one turn winding, exposes the current transformer core to asymmetric magnetic fields. This is illustrated in FIG. 2 where the primary winding 1 is placed closer to and around only one small part of the transformer core. This part 8 will be exposed to higher magnetic fields and will be saturated harder than the other part 9 of the transformer core which is exposed to less magnetic fields. It will take a longer time to desaturate the harder saturated part 8 compared to the less saturated part 9. For high primary currents, the influence of an asymmetric primary winding increase, the differences in flux level between saturated and unsaturated parts increase and the time needed to entirely desaturate the core increase.

To reduce the time needed for desaturation (reduce the influences of asymmetric magnetic fields) the secondary winding is divided in two or more separate winding sections. Each secondary winding section is locally wound at one bounded sector of the core. This is illustrated in FIG. 3 for the case of four secondary winding sections 10,11,12,13 (the primary winding is omitted for clarity). A control unit 30 controls the current in each winding section, or for each group of winding sections if the winding sections are divided into groups of winding sections connected in parallel, so as to cancel out any asymmetric magnetic fields in the core and so as to be able to desaturate all of the core sections at substantially the same time. Specifically, when the part of the transformer core on which a secondary winding section is wound starts to go out of saturation, EMF is induced in the winding section covering that unsaturated part of the transformer core. The EMF in that winding section will now only reduce the current rise in that winding section but not in other winding sections. If all of the winding sections are connected in parallel the sum of the currents through all of them equals the secondary current that would have flown in the secondary winding if the secondary winding had not been divided into winding sections, when the transformer core is in the linear region. Thus, the currents in the winding sections will self-organise to cancel out asymmetric fields in the core. From the measurement point of view, and in the above described control of the transformer, the parallel connected windings could be considered as one, but with the ability to desaturate an asymmetrically saturated transformer core quickly. Without the sectioning of the secondary winding the time it takes to desaturate the core becomes too long to gain any efficiency with the described method.

The control of the transformer is done with an H-bridge connected as in FIG. 6. The controllable switches 45, 46, 47, 48 are turned on and off according to the state and detected direction of primary current. Two shunt resistors 49, 50 are used to simplify detection of saturation and to keep the measured voltage close to ground.

Figure 6A:
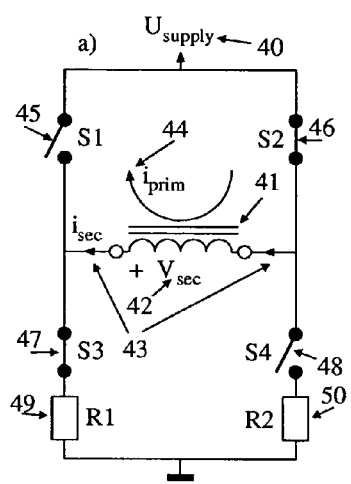
FIGS. 6a–c show the connection of the secondary winding in a H-bridge, and the states of this H-bridge in each of the states of the invention.
Figure 6B:
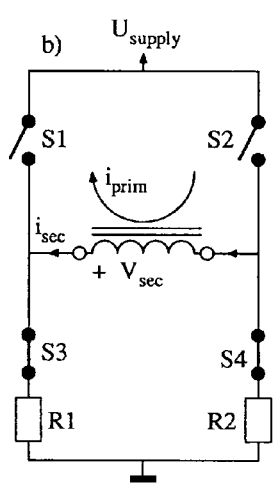

During the measurement state the lowside switches 47, 48 are turned on, and 45, 46 are turned off, independent of current direction. This is illustrated in FIG. 6b, for a positive primary current 44. The secondary current 43 produces a proportional voltage drop over the two resistors 49, 50. The voltage 42 will, for positive primary current, drive the core 41 towards positive saturation, and for negative primary current towards negative saturation. The drift will be slow, because to lower the losses low valued resistors are used, and the voltage over these low valued resistors will be lower than the supply voltage.

Figure 6C:
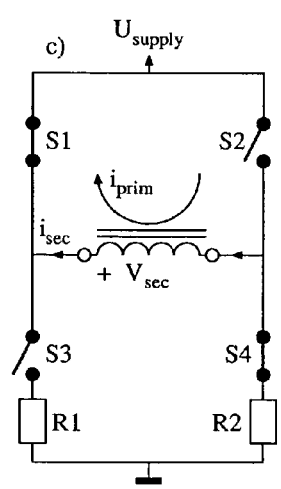

When the measurements is done and the core should be driven in to saturation during the saturation state, a voltage with the same direction as the measured voltage, but with larger magnitude (in order to make the drift fast) is applied to the secondary winding. FIG. 6c illustrates this for positive primary current. Switches 45, 48 are turned on, and 46, 47 are turned off, for positive primary current. Switches 46, 47 are turned on, and 45, 48 are turned off for negative primary current. Two shunt resistors 49, 50 are used to be able to measure secondary current during the saturation-state, and detect saturation.

When saturation is detected, during wait-state, the secondary winding is connected as in the measurement state. This will keep the flux level at saturation if the current direction does not change, with no secondary current flow as result. If the primary current changes direction, the low voltage over the resistors 49, 50 will make the core drive slowly out of saturation. The slow drive out of saturation when current has changed sign is important, because if the flux level is to far away from it's original saturated level when the desaturation-state starts, the core could be driven into saturation in the opposite direction.

Before the next measurement the flux level in the core has to be driven from saturation to a flux level in the linear region of the core material BH-curve. This is done by applying a negative, with respect to the measured, voltage to the secondary winding, this is illustrated in FIG. 6a. Switches 46, 47 are turned on, and 45, 48 are turned off, for positive primary current. Switches 45, 48 are turned on, and 46, 47 are turned off for negative primary current.

The invention claimed is:

1. A method for measuring a secondary turns-ratio scaled primary current generated in a current transformer which includes a primary winding, a secondary winding, and a core, wherein said secondary winding is separated into at least two separate winding sections provided at discrete core sections, said method comprising:

maintaining a flux level in the core at a saturated level between measurements, maintaining the flux level in the core at an unsaturated level during measurements, controlling a current in each winding section so as to cancel out any asymmetric magnetic fields in the core and so as to be able to desaturate all of said core sections at substantially a same time.

2. The method according to claim 1, wherein said winding sections are connected in parallel so that the currents in the winding sections self-organise themselves to cancel out asymmetric magnetic fields in the core.

3. The method according to claim 1, wherein the currents in said winding sections are controlled actively for one of: each one of said winding sections, and each one of at least two groups of winding sections connected in parallel.

4. The method according to claim 1, wherein the core is actively driven into the saturation level after each measurement is performed.

5. A current transformer for delivering a turns-ratio scaled secondary current, said current transformer comprising:
   a core;
   a primary winding around the core;
   a secondary winding around the core, said secondary winding comprising at least two separate winding sections wound on a respective physically bounded section of the core; and
   a control unit to control a current in said winding sections to cancel out asymmetrical magnetic fields in the core, and so as to be able to quickly drive the core from a saturated state to an unsaturated state.

6. The current transformer according to claim 5, wherein said winding sections are connected in parallel so that the currents in the winding sections self-organise themselves to cancel out asymmetric magnetic fields in the core.

7. The current transformer according to claim 5, wherein the control unit is arranged to control the current actively one of: in each one of said winding sections, and in each one of at least two groups of winding sections connected in parallel.

8. The current transformer according to claim 5, wherein the control unit is adapted to actively drive the core into the saturation state.

9. The method according to claim 2, wherein the core is actively driven into the saturation level after each measurement is performed.

10. The method according to claim 3, wherein the core is actively driven into the saturation level after each measurement is performed.

11. The current transformer according to claim 6, wherein the control unit is adapted to actively drive the core into the saturation state.

12. The current transformer according to claim 7, wherein the control unit is adapted to actively drive the core into the saturation state.

* * * * *